United States Patent [19]

Reed

[11] Patent Number: 4,964,948
[45] Date of Patent: Oct. 23, 1990

[54] PRINTED CIRCUIT BOARD THROUGH HOLE TECHNIQUE

[75] Inventor: Ronald G. Reed, Monument, Colo.

[73] Assignee: ProtoCAD, Inc., Colorado SPrings, Colo.

[21] Appl. No.: 435,703

[22] Filed: Nov. 13, 1989

Related U.S. Application Data

[60] Division of Ser. No. 172,199, Mar. 23, 1988, Pat. No. 4,911,796, which is a continuation-in-part of Ser. No. 929,390, Nov. 10, 1986, Pat. No. 4,823,277, which is a continuation-in-part of Ser. No. 725,817, Apr. 16, 1985, Pat. No. 4,720,798.

[51] Int. Cl.$^5$ ............................ B44C 1/22; C23F 1/02; C03C 15/00; C03C 25/06
[52] U.S. Cl. ................................. 156/659.1; 29/852; 156/634; 156/656; 156/902; 106/20; 427/97
[58] Field of Search ............... 156/629, 630, 634, 645, 156/656, 659.1, 901, 902, 661.6; 29/852; 427/97; 174/68.5; 106/20, 23, 25, 26, 32

[56] References Cited

U.S. PATENT DOCUMENTS

| | | | |
|---|---|---|---|
| 3,158,503 | 11/1964 | Young | 427/97 |
| 4,323,593 | 4/1982 | Tsunashima | 29/852 X |
| 4,401,686 | 8/1983 | Durand | 427/97 X |
| 4,529,477 | 7/1985 | Lundberg et al. | 156/902 X |
| 4,763,403 | 8/1988 | Klein et al. | 29/852 |

*Primary Examiner*—William A. Powell
*Attorney, Agent, or Firm*—John R. Ley

[57] ABSTRACT

A process of forming plated through-holes in a printed circuit board involves placing a film of fluid ink having electrically conductive properties on a side wall of the hole, curing the film to a solid and electroplating a layer of metal on the conductive ink film. The conductive ink preferably is a composition including conductive particles such as carbon and silver flakes. The ink also preferably includes a thermosetting or radiation curable binder and a thinner. The film of ink is cured before the layer of metal is electroplated thereon. The plated through-hole is protected from the etchant when the conductors are etched by placing a radiation curable putty material into the hole, curing it, and then depositing a layer of resist on top of the cured putty and a conductive sheet clad to the substrate of the circuit board.

8 Claims, 5 Drawing Sheets

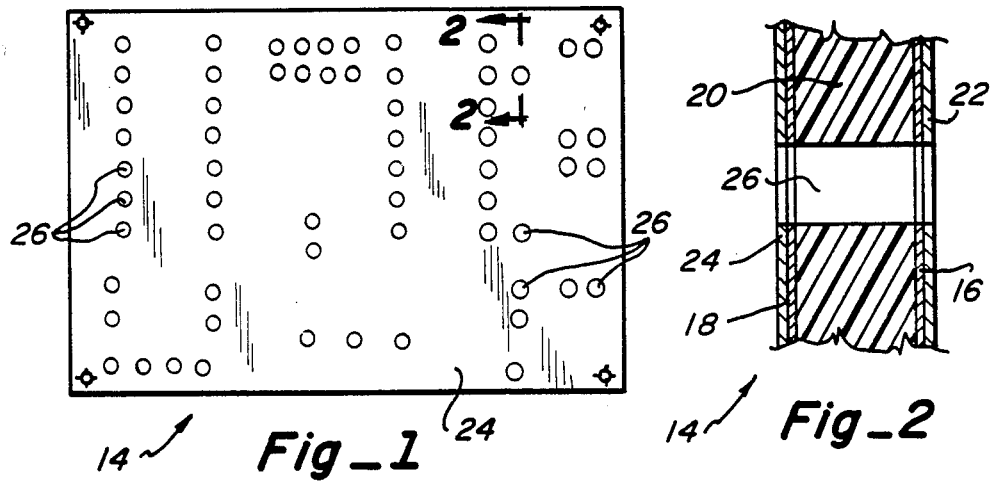
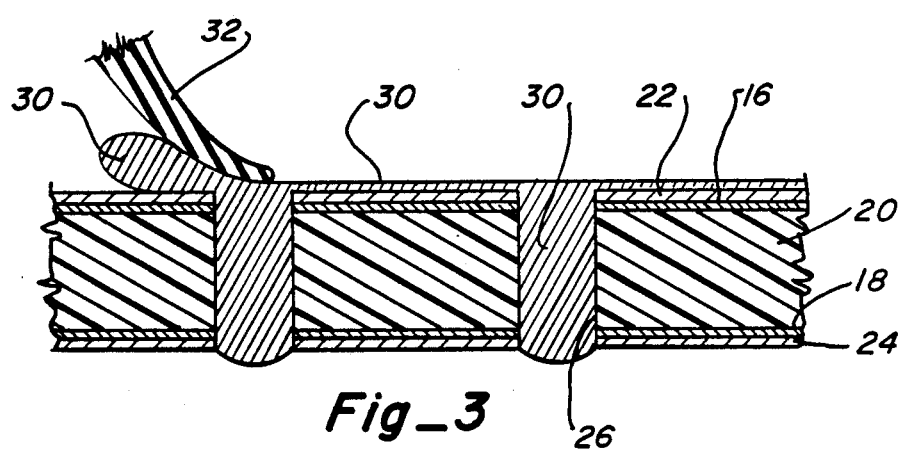
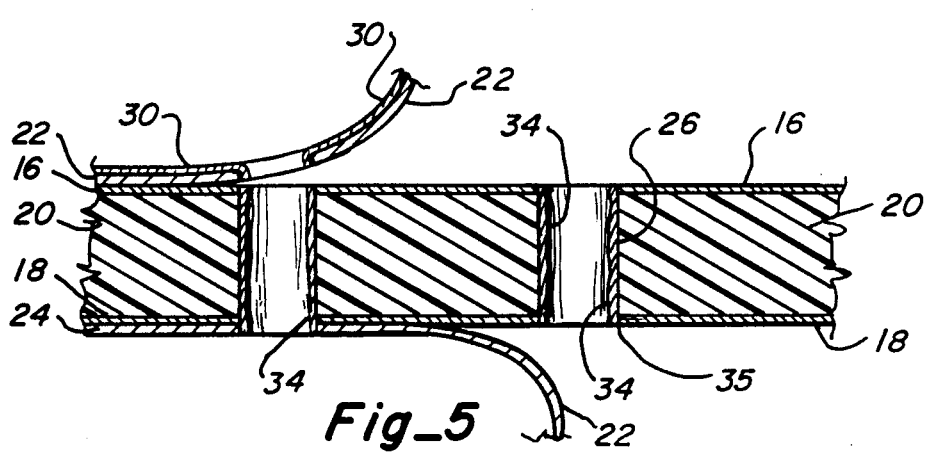

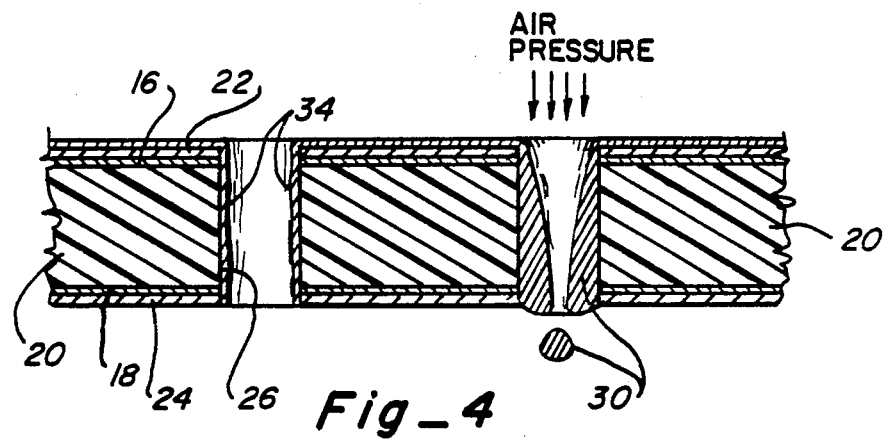
Fig_4
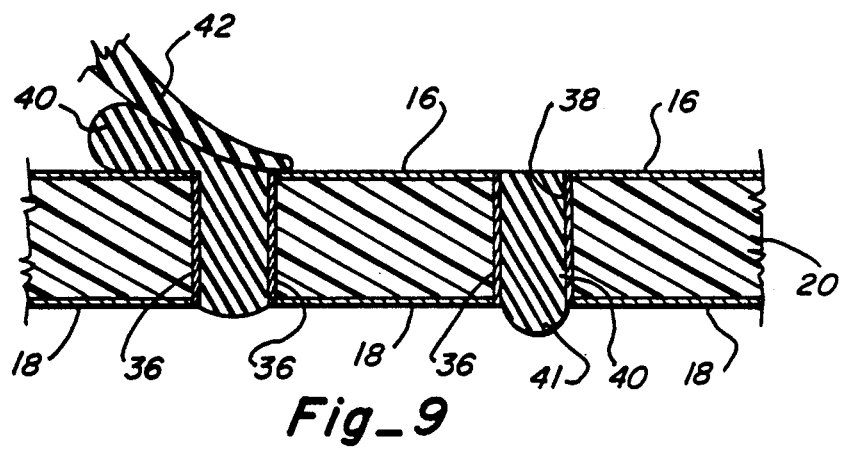
Fig_9
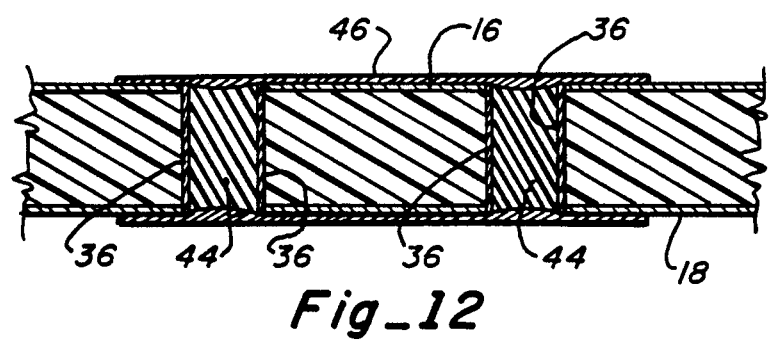
Fig_12

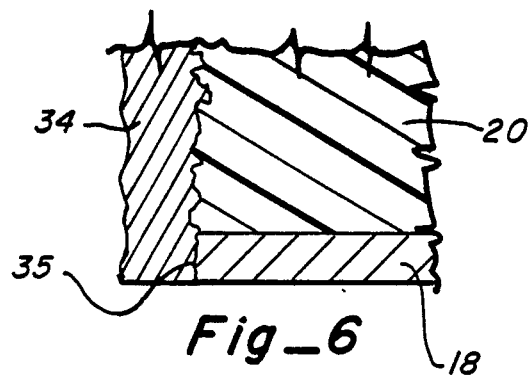
Fig_6
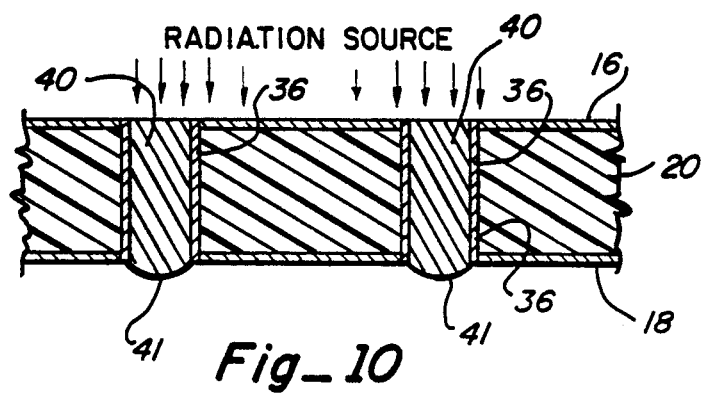
Fig_10
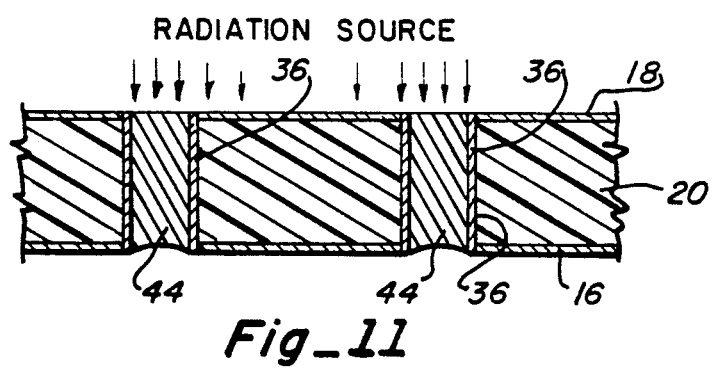
Fig_11

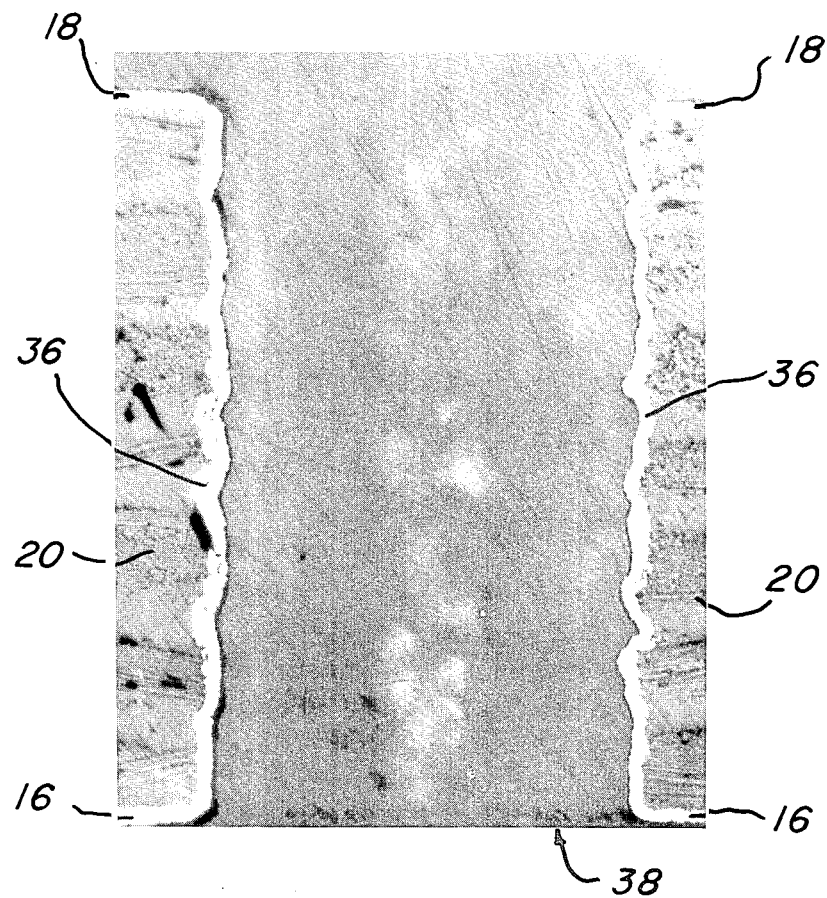
Fig_7

Fig_8

PRINTED CIRCUIT BOARD THROUGH HOLE TECHNIQUE

CROSS-REFERENCE TO RELATED APPLICATIONS

This is a divisional application of United States patent application for PLATED THROUGH-HOLES IN A PRINTED CIRCUIT BOARD, Ser. No. 172,199, filed Mar. 23, 1988, U.S. Pat. No. 4,911,796, and assigned to the assignee hereof. Patent Application Ser. No. 172,199 is a continuation in part of the United States patent application for FORMING PLATED THROUGH HOLES IN A PRINTED CIRCUIT BOARD BY USING A COMPUTER CONTROLLED PLOTTER, Ser. No. 929,390, filed Nov. 10, 1986, U.S. Pat. No. 4,823,277, and assigned to the assignee hereof. Patent application Ser. No. 929,390 is a continuation in part of the U.S. patent application for PROCESS FOR USE IN RAPIDLY PRODUCING PRINTED CIRCUIT BOARDS USING A COMPUTER CONTROLLED PLOTTER Ser. No. 725,817, filed Apr. 16, 1985, now U.S. Pat. No. 4,720,798, which is also assigned to the assignee hereof. The disclosures of all of these applications are incorporated herein by this reference.

FIELD OF THE INVENTION

The present invention pertains to the production of a printed circuit board having plated through-holes therein. More particularly, the present invention pertains to forming plated through-holes by using a conductive ink to establish a current conductive flow path onto which an electrolytic deposition of metal (copper) is made, and to protecting the plated through holes during etching of the circuit board by using a radiation curable putty.

BACKGROUND OF THE INVENTION

A printed circuit board serves as a support chassis for various discrete electronic components, such as integrated circuits, resistors, capacitors, and other components. The printed circuit board also provides the copper or other metallic conductors for conveying electrical current between the connected terminals of the electronic components. Conductors on opposite sides of the flat substrate or insulator of the board are frequently connected by plated through-holes. Plated through-holes are also useful when soldering components to the printed circuit board. Plated through-holes are created by plating copper or some other metal onto the side walls of the holes formed through the circuit board insulator or substrate, between the conductors on opposite sides of the substrate.

In the prior art, plated through-holes are produced by a complicated and time consuming process utilizing a series of chemical dipping vats and processes. Many different vats are usually used, and the chemical composition and conditions of many of these vats must be separately maintained within relatively critical tolerances. The criticality of the various prior art processes involved, and the various disadvantages associated with the prior art processes are briefly described in the aforementioned patent application Ser. No. 929,390.

The prior application Ser. No. 725,817 describes a technique used in producing printed circuit boards by employing a computer controlled plotter. Using the technique described allows printed circuit boards to be produced conveniently and quickly. The prior application Ser. No. 929,390 relates to one method of forming plated through-holes which can be employed to make printed circuit boards with the computer controlled plotter. The present invention relates to another technique of forming plated through-holes which can be employed in conjunction with the computer controlled plotter technique as well as with other independent, larger scale techniques of making printed circuit boards with plated through-holes.

SUMMARY OF THE INVENTION

By way of a generalized summary, the invention of the present process involves the use of a conductive ink applied to establish a conductive coating or film on the side walls of a hole formed through the insulator or substrate of a conductive sheet-clad board, such as a copperclad board. The conductive coating is established by the cured ink and causes the electrical field of a conventional plating bath to readily penetrate into the hole, affording sufficient copper ion transport for rapid and uniform plating onto the side wall of the hole. The ink supports a layer of electrolytically deposited copper or other metal which builds up and forms the plated through-hole.

The conductive ink is applied by filling the holes previously drilled in the sheet-clad board. The ink is then forced out of the holes, preferably by the application of air or fluid pressure, leaving a thin film of conductive ink on the walls of the holes. The ink has a relatively high thixotropy which allows it to fill the holes and remain in the holes without draining out. The thixotropy and surface tension properties of the ink are such that it can be removed from the holes with air pressure to leave a relatively thin film on the side wall of the hole.

The composition of the ink includes a thermosetting or radiation curable binder which has been thinned by a thinner, as well as electrically conductive particles, preferably a mixture of silver flake and carbon black, and an agent to create the desired thixotropic effects, preferably fumed silica. The relative proportions of these components, especially the binder and the thinner, encourage wetting of the ink to the walls of the substrate and a surface tension which, when the ink is forced out of the holes, leaves a relatively thin, smooth film of ink adhering to the walls. The thickness of film is sufficient that when the film cures, it provides the necessary conductivity for plating However, the film is not so thick that the resulting wall of plated copper will separate from the substrate or overly restrict the diameter of the hole. The combination of the silver flake and the carbon particles establishes good conductivity on the walls to support uniform, smooth plating.

After the excess ink is removed from the holes, the remaining relatively thin film is cured. Preferably the sheet-clad board is of the type which includes an aluminum peel sheet which is removably attached to the conductive sheets of the board. The peel sheet is removed, leaving a conductive film at an interface or junction between the conductive sheets on the surface of the insulator and the ink film remaining on the side walls of the holes. The presence of this conductive film at the corners is important in establishing a continuous conductive path from the conductive sheets into the hole to support plating of the desired metal on to the side walls of the holes. By curing the ink before removing the peel sheet, the cured film of conductive ink is not nearly as susceptible to disruption, breakage or separation at the interface as might occur if the surface of the conductive sheet had to be directly cleaned.

Another aspect of the invention is the use of a radiation curable putty or gel to form a hole plug to protect the plated through-holes during the conventional etching process. Enough radiation curable putty is added to completely fill the plated through-holes, preferably by extruding the putty through the plated through-holes. The putty is then exposed to radiation such as ultraviolet light to cure it, thereby forming a hole plug. Resist is then applied over the hole plug and the conductive sheets in the desired circuit pattern to protect the plated through-hole and to protect selected areas of the conductive sheets to form the desired electrical conductor circuit pattern.

The resist deposit and the hole plugs prevent the plated through-holes from being eaten away by the etchant. Etching then occurs. The resist and the hole plugs are thereafter removed and the circuit pattern, including plated through holes, remain in place.

The nature and details of the present invention are more completely described in the following description of the preferred embodiment taken in conjunction with the drawings, and the scope of the invention is better described in the appended claims.

BRIEF DESCRIPTION OF THE DRAWINGS

FIG. 1 is a plan view of a conductive sheet clad with holes formed therethrough having a peel sheet over its conductive surfaces.

FIG. 2 is an enlarged fragmentary sectional view of the board shown in FIG. 1 taken in the plane of line 2—2.

FIG. 3 is an enlarged view of the board shown in FIG. 2 illustrating the application of the conductive ink into the holes and over the peel sheet of the board.

FIG. 4 is a view similar to FIG. 3 illustrating the removal of the excessive amount of conductive ink from the hole, preferably by fluid or air pressure, and the relatively thin film of conductive ink which remains on the side wall of a hole after the excess conductive ink has been removed.

FIG. 5 is a view similar to FIG. 4 illustrating the removal of the peel sheet from the board.

FIG. 6 is an enlarged view of the section portion 6—6 shown in FIG. 5.

FIG. 7 is a magnified photographic view of an actual hole which has been plated with copper onto the conductive ink film according to the present invention.

FIG. 8 is a further magnified photographic view of a section of a typical plated through-hole similar to that shown in FIG. 7, showing the copper plating, the conductive particles of the conductive ink layer, and a segment of a fiberglass substrate of the board.

FIG. 9 is a sectional view of the circuit board similar to FIG. 5, illustrating the step of filling of the plated through holes with a radiation curable putty and the removal of the excess putty.

FIG. 10 is a view similar to FIG. 9, illustrating the curing of the putty from one side of the board.

FIG. 11 is a view similar to FIG. 10, illustrating the curing of the putty from the other side of the board and the top surfaces of the resulting hole plug.

FIG. 12 is a view illustrating the application of resist material to the outer surface of the hole plug shown in FIG. 11 and onto the surface of the conductive sheets of the board.

DESCRIPTION OF PREFERRED EMBODIMENTS

Printed circuit boards which are produced in accordance with the present invention start with a conventional conductive sheet clad board 14 which is illustrated in FIGS. 1 and 2. Conductive sheets 16 and 18 are attached on opposite sides of a center insulator or substrate 20 which is usually formed of fiberglass. Preferably the board also includes aluminum peel sheets 22 and 24, or similar release sheets, which are releasably attached to the exterior flat surfaces of the conductive sheets 16 and 18, respectively. Holes 26 have been drilled or punched completely through the substrate 20 and the sheets 16, 18, 22 and 24.

The holes 26 are located in a predetermined pattern. The predetermined pattern of the holes 26 corresponds to the location of the plated through-holes and terminals of the electronic components, conductors and other components which ultimately will be mounted onto the finished printed circuit board.

The process of the present invention commences with the application of a conductive ink 30, as is shown in FIG. 3. The conductive ink is a composition which includes electrically conductive particles, such as carbon black or graphite particles which preferably have a size less than or equal to approximately 0.5 microns, and silver flakes which preferably have a particle size less than or equal to approximately 2 microns. The conductive ink also includes a thermosetting or radiation curable binder, and a thinner, such as butyl cellosolve acetate. Fumed silica is also preferably included to create a desired thixotropic effect. The preferred composition of the conductive ink, by weight, is as follows:

| Butyl cellosolve acetate (thinner) | 400 parts |
|---|---|
| Binder | 390 parts |
| Silver flake | 280 parts |
| Carbon black | 100 parts |
| Fumed silica | 20 parts |

Variations in the above ink composition are possible but it is preferred that the compositions of the binder and thinner generally be approximately equal. The thinner component can probably be varied in the range of 30%, the carbon black can be varied in the range of 15% and the silver flake can be varied in the range of 15%, relative to the above proportions. The proportion of fumed silica should generally remain in the same proportion as the overall composition as noted in the above formula, but the amount of fumed silica can be varied to establish the desired degree of thixotropy of the ink.

Suitable types of silver flake and carbon black are commercially available from Acheson Colloid under the component designations 415SS and 423SS, respectively. Furthermore, the silver flake and carbon black are available from Acheson Colloid in a pre-mixed composition in approximately the correct proportions, including the correct proportion of binder. The thinner noted is also a commercial item, which is available from Eastman Kodak or Dow Chemical, for example. One type of fumed silica which has proved satisfactory is Cabosil TS720, which is commercially available from Cabot Laboratories.

The conductive ink can be applied in any manner to assure that it completely fills the holes, remains in place until removed, and coats the side walls of the holes when removed. The following description is the preferred example of the ink application. The conductive ink 30 is initially applied along one side of the board 14, as shown in FIG. 3. The board 14 is supported on a table (not shown) at an angle so the ink does not contact the surface or pour out. A squeegee-like applicator 32 or a roller applicator (not shown) is preferably used to spread the conductive ink 30 over one or both surfaces of the board 14 until all of the holes 26 are filled completely with the conductive ink 30, as is shown in FIG. 3. When the ink 30 is applied from one side of the board 14, a slight bulge of ink should protrude from the holes on the other side, as shown in FIG. 3. Each through-hole 26 should be filled or coated with the conductive ink 30 in order to assure integral and complete contact with the side wall of each hole in the substrate 20. The holes are checked to indicate that they are completely filled by holding the board 14 up to a light and making sure that no light is passing through any of the holes 26, or by passing the board between a source of light and an optical detector.

A hand held air blower (not shown) which supplies fluid air pressure, or another source of clean, dry compressed air, is positioned close to the peel sheet over which the conductive ink 30 has been spread. The force of the air from the blower is sufficient to force the excess conductive ink 30 out of the holes 26, leaving a thin film 34 of conductive ink adhering to the side walls of the through-holes 26, as is shown in FIG. 4.

Relatively high thixotropy of the ink is necessary to make sure that the ink remains in the holes when it is applied, but must allow the ink to become more fluid under the influence of the air pressure removal forces, causing the smooth thin film to remain on the side walls of the holes. The thixotropic characteristics result in substantial measure from the fumed silica. By increasing the content of silver flakes, the ink tends to become more viscous and the film thickness tends to increase. By adding more thinner, the silver flakes tend to become more separated, and might create electrical conductivity voids during electroplating.

The surface tension and wetting characteristics of the ink cause the ink to pull into a thin smooth surface layer or film 34 on the side walls of the holes, as the bulk of the ink is removed by the air pressure. The surface tension characteristics are important in achieving the appropriate thickness and smoothness of the ink layer. The wetting characteristics assure that all of the side wall surfaces are coated with the film. The air heated by the hand blower starts evaporating the thinner and allows the binder to commence setting up, causing the conductive ink 30 to become more stable in place. The excess conductive ink 30 in the holes 26 must be removed before the ink dries.

The carbon black is pervasive within the ink composition and tends to bridge the gaps between the silver flakes, creating electrical continuity between the individual flakes of silver thereby reducing the possibility of electrical voids between the individual silver flakes. By increasing the proportion of carbon black in the ink, greater resistivity in the conductive path is usually established because the electrical path through the more numerous and less conductive carbon particles becomes longer. In general, it has been determined that the above noted ink composition provides the best combination of adherence, thixotropy, wetting, and surface tension characteristics to create the relatively thin smooth film as the ink is forced out of the holes. The ink composition also results, when cured, in continuous conductivity to support good electrodeposition into all interior parts of the holes.

When the binder of the ink is of the thermosetting type, the board 14 is next placed in a drying oven, and the film 34 is allowed to fully cure, for approximately five minutes at 140' C. When the binder of the ink is of the radiation curable type, the board is next exposed to a source of the appropriate curing radiation for a sufficient amount of time to achieve a full cure. The board 14 is then allowed to cool to room temperature. Until fully cured, the electrical conductivity of the film of ink has not reached its highest value. Increased conductivity is achieved by shrinkage of the ink upon curing which brings conductive particles into more substantial contact. Curing occurs as a result of removal of thinner from the composition and the resulting action of the binder.

The peel sheets 22 and 24 are next removed from both sides of the board 14, as is shown in FIG. 5, after the film 34 of ink in the holes has been cured. When the peel sheets 22 and 24 separate from the conductive sheets 16 and 18, respectively, the cured film 34 of ink also separates at the same parting location, leaving a corner of the film in substantial contact at an interface 35 between the conductive sheet 16 and the cured film 34 on the hole side walls, as shown in FIG. 6. This interface 35 is important, because through it, electrical conductivity is established from the conductive sheets onto the film 34 which extends into the hole. During electroplating, the conductive sheets 22 and 24 are connected to a potential source, and the sheets become the cathode in an electrolytic plating cell. Because of the interface 35, the ink film 34 in the hole also becomes part of the cathode to support the electrolytic deposition of metal to form the plated throughhole.

Removal of the peel sheets 22 and 24 also eliminates problems of cleaning excess conductive ink 30 from the conductive sheets 16 and 18 and also substantially removes some burrs created by drilling the holes 26. However, if rings of ink have penetrated beneath the peel sheets around some of the holes 26, these rings are removed by using a moistened cloth and butyl cellusolve or propylene carbonate with a brisk rubbing action or by use of an abrasive cleaner. Any excess solvents are removed by returning the board 14 to the drying oven for a few minutes after all the rings have been removed.

The board is next dipped into a bath of a dilute solution of hydrogen peroxide (10%), sulfuric acid (10%) and deionized water (80%). The board is left in this bath for approximately five seconds, and it is moved back and forth to move the solution through the holes. The solution activates the surface of the cured ink film in the holes, by increasing the exposed surface area of the conductive particles. This bath also slightly etches the conductive sheet copper surfaces and removes any oxides and/or organic oils that might inhibit good electroplating. The activation creates a good mechanical and electrical foundation to support electrodeposition in the holes.

The board 14 is next cleaned under running tap water. A very light rubbing action with an abrasive cleaner on both sides of the board using a 400 wet or dry sandpaper removes any burrs on the conductive sheets 16 and 18 that may be remaining. It is important not to use too much abrasive action, which might break the conductive path at the interface 35 between the sheets 16 and 18 and the cured film 34 deposited on the side walls of the holes 26. The board 14 is next thoroughly rinsed under running tap water and is blown dry, which also helps remove any trapped particles within the coated through-hole.

The conductive ink film 34 in the holes 26 is ready to be plated to form the plated through-holes which are shown in FIGS. 7 and 8. The plating process is conventional and can be done in several ways. In the preferred embodiment, the board is mounted to a cathodic plating rack and inserted into a plating bath. A gentle sweeping of the board back and forth removes any trapped air from the holes 26. The conductive sheets 16 and 18 are electrically charged and a good conductive path is established through conductive particles (carbon black and silver flake) of the film 34. A uniform layer 36 of copper plating is built up on the film due to electrodeposition, as is shown in FIG. 7. The layer 36 of copper plating extends completely between the conductive sheets 16 and 18, to form plated through-holes 38. The board 14 is next thoroughly rinsed under running tap water and is blown dry, which also helps remove any residual plating solution remaining within the plated through-holes.

The characteristics of the conductive ink are very important in obtaining a good quality plated through hole. By utilizing a relatively thin film of the conductive ink to establish the conductive path upon which the copper is deposited, the electrodeposition of metal (e.g. copper) does not build up sufficiently to unduly close the hole diameter. Instead, by using the disclosed ink composition the size of the hole can be reduced in a controlled manner to maintain its size relatively close to that originally drilled.

As is shown in FIG. 8, the exterior copper surface layer 36 of the plated through-hole is deposited on the conductive film 34. The light spots within the film 34 are silver flakes, and the dark spots are the voids between the silver flakes which are filled with carbon black material. Accordingly, a good conductivity path is established between adjoining silver flakes by the carbon particles. The relatively thin film 34 also functions to fill the uneven areas in the side wall of the hole in the substrate 20 formed during drilling or punching. The smoothing effect of the conductive ink film 34 creates a smoother exterior surface layer 36 of the plated through-hole. The view in FIG. 7, although appearing rough because of the substantial magnification involved, is actually a fairly smooth, continuous and integral surface of copper in the plated through hole. Notice also in FIG. 7 that the copper surface layer 36 of the plated through-hole 38 adjoins and connects with the copper of the conductive sheets 16 and 18.

The plated through-holes 38 are next prepared to withstand etching as is shown in FIG. 9, by filling them with a radiation curable putty 40, such as that cured by ultraviolet light. The putty 40 is preferably of the free radical cure type, more specifically a transparent deep-cure aqueous developable solder mask material such as that supplied commercially by Dexter Hysol or Shipley. This type of material includes a urethane, which cross links when exposed to ultraviolet light, thereby causing the material to cure. Oxygen in the air inhibits the curing of the outermost layer of the putty 40, thereby allowing it to be easily removed from the suface of the board. It is important that no plating solution remains in the plated through-holes 38 before application of the putty since that solution might inhibit the curing and/or adhesion of the putty.

The putty is pushed or extruded through the plated through-holes 38 from a first side of the board 14 (conductive sheet 16 side upward) until a slight bulge 41 of putty protrudes through the hole on the opposite or second side of the hole, as is shown in FIG. 9. The excess putty 40 on the first side is removed until the outer surface of the putty 40 in the holes 38 is smooth and coplanar with the upper surface of the sheets 16 and 18.

The first side of the board 14 is placed under a radiation source, such as an ultraviolet light exposure unit, as is shown in FIG. 10, for an empirically determined time. This will allow the putty 40 to cure starting from the top surface at the first side of the board and advancing into the hole. During curing, the putty tends to shrink, as shrinkage upon curing is an inherent feature of the putty. By creating the bulge 41 on the opposite side of the board, a reservoir of putty is created which tends to replace the shrinkage and thereby minimize the concavity at the outer surfaces of the putty in the holes. The exposure to the curing radiation is timed so that the front of cure does not advance completely to the opposite or second side of board. Thereafter the board is turned over, the bulge on the second side (conductive sheet 18 side upward) is leveled, or more putty is added (if needed) to level the upper surface of the putty even with the outer surface of the board, and the putty is cured from the second side, as is shown in FIG. 11. A completely cured hole plug 44 results when the putty in the holes becomes rigid. The cured exterior surfaces of the hole plug 44 are somewhat concaved as a result of the shrinkage, but the amount of the concavity is minimized as a result of the technique described above.

By curing the putty by this two step process, any shadowing of the putty by any impurities or foreign material at the outer surface on either side or by roughness of the hole wall is avoided. Shadowing will cause the underlying material to be uncured as a result of no radiation interacting with that material. By exposing both sides separately, the shadowing is avoided.

The putty should not be permitted to contact any work surface before it is fully cured, and the board 14 should, therefore, be supported so that this does not occur. Contact between the putty 40 and any other surface prior to curing might result in pulling some of the putty 40 out of the holes 38 or might roughen or move the outer surface of the putty.

After the hole plug 44 has adequately cured, the board 14 is abrasively cleaned and rinsed thoroughly under tap water. After the board 14 has been thoroughly dried, the resist 46 is applied on the conductive sheets 16 and 18 and over the tops of the hole plugs 44, as is shown in FIG. 12. The resist can be applied in any acceptable manner including the technique described in the previously mentioned U.S. Pat. No. 4,720,798. By minimizing the effects of the shrinkage, as described above, the resulting concavity in the outer surfaces of the hole plug is not so large as to cause the resist to substantially pool in the concavities of the hole plugs, thereby drawing the resist away from the corners of the hole and exposing the copper at those locations. The resist layer over the hole plugs is of sufficient thickness to adequatey protect the copper at the corners of the plated through-hole during the etching process.

After the resist 46 has been cured, the board is dipped into an etchant bath and areas of the conductive sheets 16 and 18 which are not protected by the resist 46 are etched away, to leave the pattern of circuit conductors on the exterior surfaces of the substrate 20. Thereafter, the remaining resist and the hole plugs 44 are removed by conventional cleaners, such as an alkaline stripping solution consisting of a 5%. solution of sodium hydroxide (NaOH) in a heated (40' C.) ultrasonic bath.

Under some circumstances it may be advantageous not to remove all of the cured putty from the holes. For example, the expansion and contraction characteristics of solder (a tin and lead mixture) could possibly, over time, loosen the copper side wall of any plated through-hole from the fiberglass substrate or from the surface conductors. To possibly avoid such a situation, the hole plug might be drilled out, leaving a small sleeve of cured material between the conductor inserted in the hole and the plated-on copper side wall. Solder would be applied only on the outer surface of the conductors surrounding the conductor. The remaining sleeve of cured putty would compensate for the differences in thermal expansion and contraction.

Another use for the curable putty is to create an anchor for screws or other fasteners in the circuit board. The putty is inserted in a hole drilled in the fiberglass substrate, or in a plated through-hole, and a mandrel is inserted in the uncured putty. The mandrel is formed with threads or another anchoring configuration. The putty is then cured and the mandrel is removed. The resulting plug then forms an anchor receiving receptacle by which screws can be conveniently attached to the circuit board.

The foregoing description describes the preferred steps of the process of the present invention with a degree of specificity. It should be understood, however, that the description has been made by way of preferred example and that the invention is defined by the scope of the appended claims.

What is claimed:

1. A composition of conductive ink for use in a process for producing plated through-holes in a printed circuit board, comprising:
   carbon black having a particle size generally less than or equal to 0.5 microns, silver flake having a particle size generally less than or equal to 2 microns, a thinner, one of a thermosetting or radiation curable binder, and fumed silica.

2. A composition as defined in claim 1 wherein said carbon black forms about 100 parts of the composition by weight, said silver flake forms about 280 parts of the composition by weight, said thinner forms about 400 parts of the composition by weight, said binder forms about 390 parts of the composition by weight, and fumed silica forms about 20 parts of the composition by weight.

3. An ink as defined in claim 1 wherein the carbon particles and the silver flake are approximately equal by weight in the conductive ink.

4. An ink as defined in claim 1 wherein the silver flake has a particle size of generally less than or equal to 2 microns.

5. An ink as defined in claim 1 wherein the carbon particles are carbon black particles which have a particle size of generally less than 2 microns.

6. An ink as defined in claim 1 wherein the binder is a radiation cureable binder.

7. A process for protecting plated through-holes in a conductor sheet-clad board during etching when producing a printed circuit board, comprising:
   filling the holes with a radiation curable putty,
   curing the putty in the hole by exposing the putty to radiation to form a hole plug,
   depositing resist on the hole plug and the adjacent conductor sheet which is clad to the board to describe the desired circuit pattern, and
   accomplishing all of the foregoing steps prior to etching the exposed conductor to create the circuit pattern.

8. A process of forming an anchor for an attachment device in a printed circuit board having a non-conductive substrate comprising:
   forming a receptacle in the substrate,
   inserting radiation curable putty into the receptacle,
   forming an anchoring configuration in the putty suitable for receiving the attachment device, and
   curing the putty by exposing it to radiation.

* * * * *